US007566435B2

United States Patent
Chen et al.

(10) Patent No.: US 7,566,435 B2
(45) Date of Patent: Jul. 28, 2009

(54) NANOWIRES AND METHOD FOR MAKING THE SAME

(75) Inventors: Hsueh-Shih Chen, Hsinchu (TW); Shu-Ru Chung, Baoshan Township, Hsinchu County (TW); Gwo-Yang Chang, Sansia Township, Taipei County (TW); Shih-Jung Tsai, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 400 days.

(21) Appl. No.: 11/507,448

(22) Filed: Aug. 22, 2006

(65) Prior Publication Data
US 2007/0155173 A1  Jul. 5, 2007

(30) Foreign Application Priority Data
Dec. 30, 2005  (TW) .............................. 94147580 A

(51) Int. Cl.
| C01B 19/00 | (2006.01) |
| C01B 19/04 | (2006.01) |
| C01B 17/00 | (2006.01) |
| H01M 4/58 | (2006.01) |
| C01G 9/08 | (2006.01) |
| C01B 17/42 | (2006.01) |
| H01L 21/36 | (2006.01) |

(52) U.S. Cl. .................... 423/566.1; 423/508; 423/509; 423/511; 423/561.1; 423/566.3; 438/666; 977/773; 977/775; 977/813; 977/824

(58) Field of Classification Search .................. 977/824
See application file for complete search history.

(56) References Cited
U.S. PATENT DOCUMENTS
6,225,198 B1 * 5/2001 Alivisatos et al. ........... 438/497

2005/0054004 A1  3/2005 Alivisatos et al. ............ 435/7.1
2005/0212079 A1 * 9/2005 Stumbo et al. .............. 257/528

(Continued)

FOREIGN PATENT DOCUMENTS

CN         1514467         7/2004

(Continued)

OTHER PUBLICATIONS

Liberato Manna et al., "Synthesis of Soluble and Processable Rod-, Arrow-, Teardrop-, and Tetrapod-Shaped CdSe Nanocrystals", J. Am. Chem. Soc. 2000, 122, 12700-12706.

(Continued)

*Primary Examiner*—Melvin C Mayes
*Assistant Examiner*—Guinever S Gregorio
(74) *Attorney, Agent, or Firm*—Bacon & Thomas, PLLC

(57) ABSTRACT

A method for preparing nanowires is disclosed, which comprises the following steps: (a) providing a first precursor solution containing IIB group elements, and a second precursor solution containing VIA group elements; (b) mixing and heating the first precursor solution and the second precursor solution to form a mixed solution; and (c) cooling the mixed solution and filtering the mixed solution to obtain nanowires. The first precursor solution includes compounds of IIB group elements and a surfactant. The second precursor solution includes compounds of VIA group elements. Besides, the surfactant is an organic acid having an aromatic group or a salt thereof.

13 Claims, 3 Drawing Sheets

U.S. PATENT DOCUMENTS

2006/0039850 A1 * 2/2006 Jun et al. .................. 423/561.1
2006/0062720 A1 * 3/2006 Jang et al. ................ 423/566.1
2006/0204431 A1 * 9/2006 Kawazoe et al. ............ 423/509

FOREIGN PATENT DOCUMENTS

WO    WO 0217362    *  2/2002
WO    WO 2004/060797    *  7/2004

OTHER PUBLICATIONS

Xiaogang Peng et al., "Shape Control of CdSe Nanocrystals", Nature, vol. 404, Mar. 2000, pp. 59-61.

* cited by examiner

NANOWIRES AND METHOD FOR MAKING THE SAME

BACKGROUND OF THE INVENTION

1. Field of the Invention

The present invention relates to a nanowire and the method for manufacturing the same and, more particularly, to a group II-VI nanowire and its manufacturing method.

2. Description of Related Art

Recently, a variety of one-dimensional nanostructured materials have been developed since carbonaceous nanotubes appeared. In fact, nanowire is a one-dimensional nanostructured material in a shape of a line. Unlike other common crystals, nanowire does not have impurities, lattice defects, and dislocation because of the nanostructure of the nanowire. Hence, nanowire has good crystal structure, and good characteristics compared with those of the common crystals. Therefore, nanowires can be applied to electronic devices, photoelectronic devices, or detectors for sensing poisonous gas. In addition, since the structure of nanowire is restricted in one-dimension, nanowires can also be used in semiconductors with this structure limit. The example for this application can be minute semiconductor devices, such as single electron transistors, or field effect transistors. Besides, a miniature photoelectronic device, such as a photon crystal or a nano-laser device, can also show good performance by introducing nanowire therein.

Currently, the main material of nanowire is metal oxides such as indium oxide ($In_2O_3$), zinc oxide (ZnO), magnesium oxide (MgO), tin oxide ($SnO_2$) and so on. At the same time, nanowire made of other materials, such as silicon nitride ($Si_3N_4$), gallium nitride (GaN), gallium arsenide (GaAs), gallium oxide ($Ga_2O_3$), or copper sulfide (CuS), have also been successfully synthesized. Among them, nanowires made of the group II-VI semiconductor show good photoelectronic properties. Therefore, group II-VI semiconductor nanowire is popularly studied and widely used in many devices, such as light emitting diodes, solar cells, or detectors.

There are currently many research groups interested in the researches of zinc oxide nanowire, especially the zinc oxide nanowire synthesized by chemical vapor deposition (CVD). However, most of the results reveal that the energy gap of zinc oxide is large whereby the absorption wavelength and the radiation wavelength of the zinc oxide falls in ultraviolet light region of the spectrum. As a result, the application of zinc oxide nanowire for the photoelectronic devices is restricted. On the other hand, the study of CdSe nanorod has also been disclosed in the research reports. However, the length of CdSe nanowire only ranges from 50 nm to 70 nm. Although some research reports reveal that the length of CdSe nanorod can be extended by multiple injection method, its length is still below 100 nm, and the diameter of the CdSe nanorod is irregular.

Therefore, it is desirable to provide improved group II-VI nanowires with a length over 100 nm and a method for manufacturing the same nanowires for the application in an electronic device, a photoelectronic device, or a detector.

SUMMARY OF THE INVENTION

The present invention relates to a method for manufacturing nanowires, comprising the steps of: (a) providing a first precursor solution containing a group IIB element, and a second precursor solution containing a group VIA element; (b) heating and mixing the first precursor solution and the second precursor solution to form a mixed solution; and (c) cooling and separating the mixed solution to obtain nanowires; wherein, the first precursor solution comprises a compound of IIB group element and a surfactant, the second precursor solution comprises a compound of VIA group element, and the surfactant is an organic acid having an aromatic functional group or a salt thereof.

The group IIB element in the first precursor solution is not limited, and is preferred to be zinc (Zn), cadmium (Cd), mercury (Hg) or the combination thereof. The compound of IIB group element in the first precursor solution is not limited, and is preferred to be zinc oxide, cadmium oxide, mercury oxide, or the combination thereof. The group VIA element in the second precursor solution is not limited, and is preferred to be sulfur (S), selenium (Se), tellurium (Te), or the combination thereof. Therefore, the formed nanowires can be any compound comprising a group IIB element and a group VIA element. Preferably, the formed nanowire is a compound selected from a group consisting of ZnSe, CdSe, HgSe, ZnS, CdS, HgS, ZnTe, CdTe, HgTe, and ZnSeS.

The surfactant in the first precursor can be any organic acid with large steric effect or a salt thereof. Preferably, the surfactant is an organic acid having an aromatic functional group or a salt thereof. More preferably, the surfactant is benzoic acid, terephthalic acid, para-phenylene-diacetic acid, para-phenylene-dipropionic acid, isophthalic acid, meta-phenylene-diacetic acid, meta-phenylene-dipropionic acid, phthalic acid, ortho-phenylene-diacetic acid, or ortho-phenylene-dipropionic acid. The solvent in the first precursor solution can be any solvent that has the ability to dissolve compounds of a group IIB element and a surfactant in the first precursor solution simultaneously, and melts but shows no decomposition at high temperature. Preferably, the solvent in the first solution is tri-n-octylphosphine oxide (TOPO) or Tributylphosphine (TBP). The solvent in the second precursor solution can be any solvent that melts but shows no decomposition at high temperature. Preferably, the solvent in the second precursor solution is tri-n-octylphosphine (TOP). Moreover, the method to disperse the above prepared solutions is not limited. Preferably, supersonic vibration can be utilized to assist the dispersion when the above solutions are prepared.

In the method for manufacturing nanowires of the present invention, the heating temperature is in a range of 100° C. to 600° C. when the first precursor solution and the second precursor solution are heated and mixed to form the mixed solution in step (b). Preferably, the heating temperature is in a range of 100° C. to 400° C. Furthermore, the first precursor solution can be preheated to a predetermined temperature of 100° C. to 400° C. before the first precursor solution and the second precursor solution are heated and mixed in step (b). In addition, the manufacturing conditions of concentrations of the reactants in the first precursor solution and the second solution, the reaction times, and the reaction temperatures in the method of the present invention are not limited, because the conditions illustrated above can be adjusted according to the solvents used in the method and the diameter-size of the produced nanowires. Also, these conditions are well known by those with ordinary skills in the art of the present invention.

Furthermore, the present invention also relates to a nanowire represented by formula (1):

$$MX \qquad (I)$$

wherein M is zinc (Zn), cadmium (Cd), mercury (Hg), or the combination thereof, and X is sulfur (S), selenium (Se), tellurium (Te), or the combination thereof. The length of the nanowire ranges from 150 nm to 1000 nm. Preferably, the length of the nanowire ranges from 200 nm to 800 nm. More preferably, the length of the nanowire ranges from 200 nm to 600 nm.

Therefore, the nanowires of the present invention can be any compound comprising a group IIB element and a group VIA element. Preferably, the nanowire is a compound of ZnSe, ZnTe, ZnS, or CdSe. Besides, the nanowire of the present invention can be in a shape of a wound-thread or a rod. The nanowire of the present invention can be applied to an electronic device, a photoelectronic device, or a detector.

Other objects, advantages, and novel features of the invention will become more apparent from the following detailed description when taken in conjunction with the accompanying drawings.

DETAILED DESCRIPTION OF THE PREFERRED EMBODIMENT

Embodiment 1

Manufacturing of ZnSe Nanowires

To start, the first precursor solution and the second precursor solution are prepared. The sequence of preparing these two solutions is not limited. Supersonic vibration can be utilized to assist the dispersion when these two solutions are prepared. The detailed steps for preparing these solutions are described as follow:

First, 1 gram of selenium (Se) powder is dried in a vacuum to remove moisture. Then, the dried selenium powder and 2 gram of tri-n-octylphosphine (TOP) are mixed and dispersed by supersonic vibration for 30 minutes under an inert atmosphere to form a second precursor solution. This second precursor solution is a colorless liquid.

In another aspect, 1 gram of zinc oxide powder is added in a three-neck bottle, and is heated to 120° C. under an inert atmosphere to remove moisture. After cooling to room temperature, 40 gram of benzoic acid and 20 gram of tri-n-octylphosphine oxide (TOPO) are added to the three-neck bottle to form a first precursor solution. The first precursor solution is then heated to 150° C. and maintained for 20 minutes to form a complex of zinc benzoic acid and tri-n-octylphosphine oxide (TOPO). At this time, the first precursor solution is a transparent liquid solution. Subsequently, the first precursor solution is heated to 300° C. After the temperature of the first precursor solution has risen to 300° C. through heating, the second precursor solution is added to the first precursor solution to form a melted mixture comprising plural ZnSe nanowires dispersed therein. Finally, the mixture is cooled and separated to obtain ZnSe nanowires.

Figure 1A:
FIG. 1a shows a transmission electronic microscopic picture of ZnSe nanowires according to Embodiment 1 of the present invention.
Figure 1B:
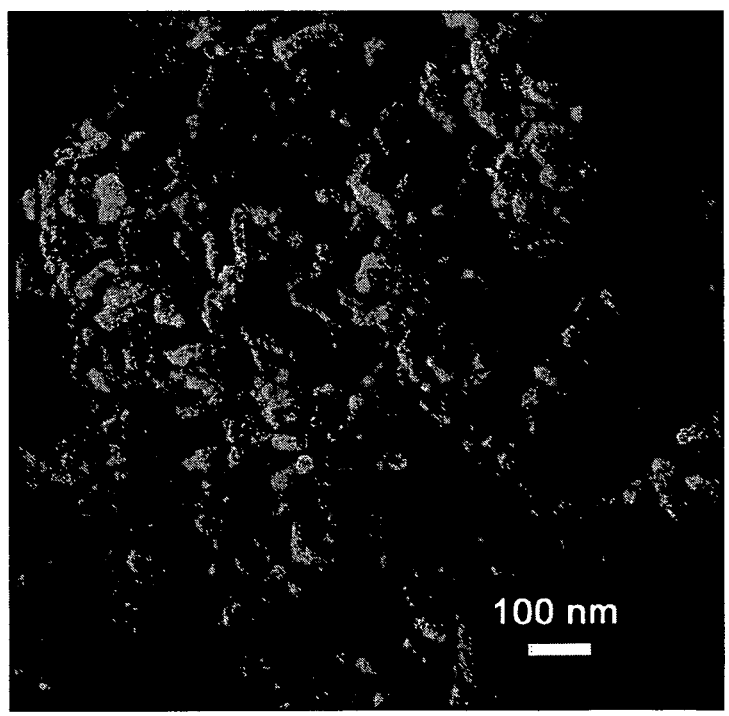
FIG. 1b shows a scanning electronic microscopic picture of ZnSe nanowires according to Embodiment 1 of the present invention.

FIG. 1a shows a transmission electronic microscopic (TEM) picture of ZnSe nanowires produced according to the steps described in Embodiment 1 of the present invention. FIG 1b shows a scanning electronic microscopic (SEM) picture of ZnSe nanowires made according to steps described in Embodiment 1 of the present invention. From the images shown in FIGS. 1a and 1b, the ZnSe nanowires are wires having a length in a range of 150 to 1000 nm. The crystal of ZnSe nanowires grows on (111) face of the nanocrystal.

Embodiment 2

Manufacturing ZnTe Nanowires

Figure 2:
FIG. 2 shows a transmission electronic microscopic picture of ZnTe nanowires according to Embodiment 2 of the present invention.

The method of the present embodiment is similar to that described in Embodiment 1, except that the selenium (Se) powder is replaced by tellurium (Te) powder. With reference to FIG. 2, FIG. 2 shows a transmission electronic microscopic (TEM) picture of ZnTe nanowires of the present embodiment. According to the image of FIG. 2, ZnTe nanowires are wires having a length in a range of 150 nm to 1000 nm.

Embodiment 3

Manufacturing ZnS Nanowires

Figure 3:
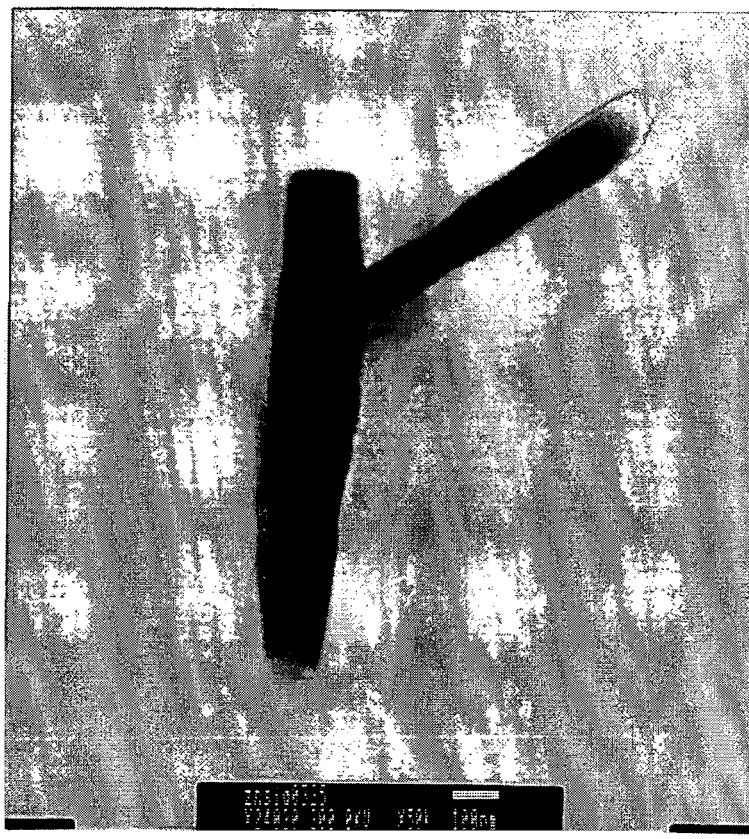
FIG. 3 shows a transmission electronic microscopic picture of ZnS nanowires according to Embodiment 3 of the present invention.

The method of the present embodiment is similar to that described in Embodiment 1, except that the selenium (Se) powder are replaced by sulfur (S) powder. With reference to FIG. 3, a transmission electronic microscopic (TEM) picture of ZnTe nanowires of the present embodiment is shown. According to the images shown in FIG. 3, ZnTe nanowires are wires having a length ranging from 150 nm to 1000 nm.

Embodiment 4

Manufacturing CdSe Nanowires

First, 1 gram of selenium (Se) powder is dried in the vacuum to remove moisture. Then, the dried selenium powder and 2 gram of tri-n-octylphosphine (TOP) are mixed and dispersed by supersonic vibration for 30 minutes under an inert atmosphere to form a second precursor solution. This second precursor solution is a colorless liquid.

Figure 4:
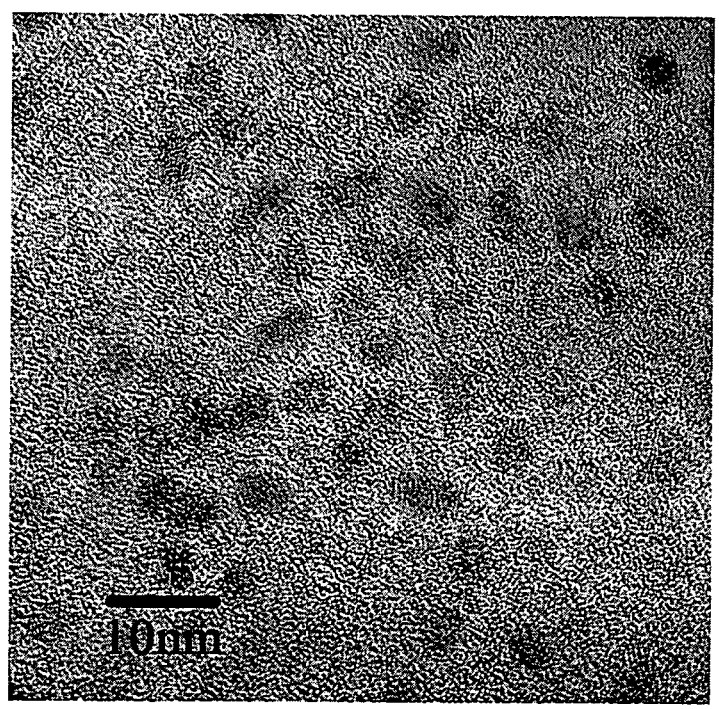
FIG. 4 shows a transmission electronic microscopic picture of CdSe nanowires according to Embodiment 4 of the present invention.

In another aspect, 1 gram of CdO powder is added in a three-neck bottle, and is heated to 120° C. under an inert atmosphere to remove moisture. After cooling to room temperature, 40 gram of benzoic acid and 20 gram of tri-n-octylphosphine oxide (TOPO) are added to the three-neck bottle to form a first precursor solution. The first precursor solution is heated to 150° C. and maintained for 20 minutes. Subsequently, the first precursor solution is heated to 300° C. After the temperature of the first precursor solution has risen to 300° C. through heating, the second precursor solution is added to the first precursor solution to form a melted mixture comprising plural CdSe rods dispersed therein. Finally, the mixture is cooled and separated to obtain CdSe nanorods. FIG. 4 shows a transmission electronic microscopic (TEM) picture of CdSe nanorods of the present embodiment.

Embodiment 5

Manufacturing ZnSe Nanowires

The manufacturing conditions of concentrations of the reactants in the first precursor solution and the second solution, the reaction times, and the reaction temperatures in the method can be adjusted according to the solvents used in the method and the diameter-size of the produced nanowires. For example, the manufacturing steps of long ZnSe nanowire (>300 nm), short ZnSe nanowire (<300 nm), and ZnSe nanorod (20~50 nm) are described as follow:

Long ZnSe Nanowire (>300 nm)

First, 4 mmole of selenium (Se) powder is dried in the vacuum to remove moisture. Then, the dried selenium powder, 4 ml of tri-n-octylphosphine (TOP), and 2 ml of toluene are mixed and dispersed by supersonic vibration for 30 minutes under an inert atmosphere to form a colorless second precursor solution. (TOP can be replaced by the same amount of tributylphosphine, (TBP))

In another aspect, 4 mmole of ZnO powder is added in a three-neck bottle, and is heated to 120° C. under an inert atmosphere to remove moisture. After cooling to room temperature, 40 mmole of benzoic acid and 20 mmole of tri-n-octylphosphine oxide (TOPO) are added to the three-neck bottle to form a first precursor solution. The first precursor solution is heated to 150° C. and maintained for 10 minutes. Subsequently, the first precursor solution is heated to 320° C. and maintained for 20 minutes. After that, the second precursor solution is added to the first precursor solution to react for 30 minutes, and ZnSe nanowires with a length larger than 300 nm are then obtained.

Short ZnSe Nanowires (<300 nm)

First, 4 mmole of selenium (Se) powder is dried in the vacuum to remove moisture. Then, the dried selenium powder, 4 ml of tri-n-octylphosphine (TOP), and 2 ml of toluene are mixed and dispersed by supersonic vibration for 30 minutes under an inert atmosphere to form a colorless second precursor solution. (TOP can be replaced by the same amount of tributylphosphine, (TBP))

In another aspect, 4 mmole of ZnO powder is added in a three-neck bottle, and is heated to 120° C. under an inert atmosphere to remove moisture. After cooling to room temperature, 40 mmole of benzoic acid and 20 mmole of tri-n-octylphosphine oxide (TOPO) are added to the three-neck bottle to form a first precursor solution. The first precursor solution is heated to 150° C. and maintained for 10 minutes. Subsequently, the first precursor solution is heated to 360° C. and maintained for 20 minutes. After that, the second precursor solution is added to the first precursor solution to react for 10 minutes, and ZnSe nanowires with a length shorter than 300 nm are then obtained.

ZnSe Nanorods (20~50 nm)

First, 1 mmole of selenium (Se) powder is dried in the vacuum to remove moisture. Then, the dried selenium powder, 2 ml of tri-n-octylphosphine (TOP), and 2 ml of toluene are mixed and dispersed by supersonic vibration for 30 minutes under an inert atmosphere to form a colorless second precursor solution. (TOP can be replaced by same amount of tributylphosphine, (TBP))

In another aspect, 1 mmole of ZnO powder is added in a three-neck bottle, and is heated to 120° C. under an inert atmosphere to remove moisture. After cooling to room temperature, 40 mmole of benzoic acid and 20 mmole of tri-n-octylphosphine oxide (TOPO) are added to the three-neck bottle to form a first precursor solution. The first precursor solution is heated to 150° C. and maintained for 10 minutes. Subsequently, the first precursor solution is heated to 360° C. and maintained for 20 minutes. After that, the second precursor solution is added to the first precursor solution to react for 10 minutes, and ZnSe nanorods with a length in a range of 20-50 nm are then obtained.

Although the present invention has been explained in relation to its preferred embodiment, it is to be understood that many other possible modifications and variations can be made without departing from the scope of the invention as hereinafter claimed.

What is claimed is:

1. A method for manufacturing nanowires, comprising the steps of:
   (a) providing a first precursor solution containing a group IIB element, and a second precursor solution containing a group VIA element;
   (b) heating and mixing the first precursor solution and the second precursor solution to form a mixed solution; and
   (c) cooling and separating the mixed solution to obtain nanowires; wherein, the first precursor solution comprises a compound of IIB group element and a surfactant, the second precursor solution comprises a compound of VIA group element, and the surfactant is benzoic acid, terephthalic acid, para-phenylene-diacetic acid, para-phenylene-diproponic acid, isophthalic acid, meta-phenylene-diacetic acid, meta-phenylene-diproponic acid, phthalic acid, ortho-phenylene-diacetic acid, ortho-phenylene-diproponic acid.

2. The method as claimed in claim 1, wherein the length of the nanowire ranges from 150 nm to 1000 nm.

3. The method as claimed in claim 1, wherein the length of the nanowire ranges from 200 nm to 800 nm.

4. The method as claimed in claim 1, wherein the group IIB element is zinc (Zn), cadmium (Cd), mercury (Hg), or the combination thereof.

5. The method as claimed in claim 1, wherein the compound of IIB group element is zinc oxide, cadmium oxide, mercury oxide, or the combination thereof.

6. The method as claimed in claim 1, wherein the compound of IIB group element is zinc oxide.

7. The method as claimed in claim 1, wherein the group VIA element is sulfur (S), selenium (Se), tellurium (Te), or the combination thereof.

8. The method as claimed in claim 1, wherein the nanowire is a compound selected from a group consisting of ZnSe, CdSe, HgSe, ZnS, CdS, HgS, ZnTe, CdTe, HgTe, and ZnSeS.

9. The method as claimed in claim 1, wherein the nanowire is a compound of ZnSe, ZnTe, ZnS, or CdSe.

10. The method as claimed in claim 1, wherein the first precursor solution further comprises a tri-n-octylphosphine oxide (TOPO) solvent.

11. The method as claimed in claim 1, wherein the second precursor solution further comprises a tri-n-octylphosphine (TOP) solvent, or a tributylphosphine (TBP) solvent.

12. The method as claimed in claim 1, wherein the heating temperature of step (b) ranges from 100° C. to 400° C.

13. The method as claimed in claim 1, further comprising a step of preheating the first precursor solution to a predetermined temperature of 100° C. to 400° C. before the first precursor solution and the second precursor solution is heated and mixed in step (b).

* * * * *